United States Patent
Karasawa et al.

[11] Patent Number: 6,008,071
[45] Date of Patent: Dec. 28, 1999

[54] METHOD OF FORMING SOLDER BUMPS ONTO AN INTEGRATED CIRCUIT DEVICE

[75] Inventors: Kazuaki Karasawa; Teru Nakanishi; Toshiya Akamatsu, all of Kawasaki, Japan

[73] Assignee: Fujitsu Limited, Kawasaki, Japan

[21] Appl. No.: 08/649,837

[22] Filed: Apr. 30, 1996

[30] Foreign Application Priority Data

Sep. 20, 1995 [JP] Japan .................................. 7-242116

[51] Int. Cl.$^6$ .................................. H01L 21/283
[52] U.S. Cl. ..................... 438/115; 438/616; 228/180.22
[58] Field of Search .................... 438/115, 616, 438/FOR 343, FOR 370; 228/180.22

[56] References Cited

U.S. PATENT DOCUMENTS

| | | |
|---|---|---|
| 3,621,564 | 11/1971 | Tanaka et al. . |
| 3,719,981 | 3/1973 | Steitz . |
| 4,818,728 | 4/1989 | Rai et al. ................. 437/209 |
| 4,857,482 | 8/1989 | Saito et al. . |
| 5,075,965 | 12/1991 | Carey et al. ................. 29/840 |
| 5,135,606 | 8/1992 | Kato et al. . |
| 5,145,552 | 9/1992 | Yoshizawa et al. . |
| 5,164,336 | 11/1992 | Ohno et al. . |
| 5,284,796 | 2/1994 | Nakanishi et al. ................. 427/183 |
| 5,611,481 | 3/1997 | Akamatsu et al. ................. 228/180.22 |
| 5,640,052 | 6/1997 | Tsukamato ................. 257/781 |

FOREIGN PATENT DOCUMENTS 63-261857 10/1988 Japan .
5-235003 9/1993 Japan .

OTHER PUBLICATIONS

"Solder Ball Connectin Tensile–Pull Method", IBM TDB vol. 34 No. 11, pp. 152–153, Apr. 1992.

*Primary Examiner*—David Graybill
*Attorney, Agent, or Firm*—Staas & Halsey

[57] ABSTRACT

Methods for forming solder bumps on terminal pads of a semiconductor substrate for an integrated circuit device employ a solder bump transfer plate and a mask to form solder deposits on the plate. One embodiment of the invention employs a metal mask having a plurality of through holes for forming solder deposits on the solder bump transfer plate by vapor phase deposition through the through holes each area of which increases in step wise from the first surface of the mask to the second surface opposite to the first surface, thereby preventing solder deposits in the through holes from being removed when the mask is separated from the plate. Another embodiment of the invention is a solder bump transfer plate having a plurality of solder deposits on the surface non-wettable to molten solder both diameter and spacing of which are both smaller than diameter and spacing of the terminal pads on the semiconductor substrate, whereby a single solder bump is accurately formed on each of the terminal pads.

18 Claims, 8 Drawing Sheets

METHOD OF FORMING SOLDER BUMPS ONTO AN INTEGRATED CIRCUIT DEVICE

FIELD OF INVENTION

The present invention relates to an integrated circuit device and, more particularly, to methods of transferring solder bumps onto an integrated circuit device, such as a flip chip semiconductor device, and to an apparatus for transferring the solder bumps, such as a solder bump transfer plate or a metal mask for forming solder deposits on the plate.

BACKGROUND OF THE INVENTION

It is known that a semiconductor chip having an array of terminal pads on a chip surface is mounted on a printed circuit board or another semiconductor chip also having an array of terminal pads by flip-chip method, wherein the arrays of terminal pads on a chip are connected with each other by vertical solder bump interconnections between a chip and a printed circuit board or another semiconductor chip. For typical processing, solder bumps are transferred from a solder bump transfer plate to each of terminal pads on a chip surface. Solder deposits on a solder bump transfer plate are usually formed on a glass substrate by vapor phase deposition with a metal mask or by selective electroplating method. Generally, as packing-density of integrated circuits increases, both size and space of terminal pads are needed to decrease, from which various technical problems arise, such as solder bridges connecting between adjacent terminal pads causing short circuits between the terminal pads, or non-uniformity of the amount of solder applied, per pad, causing electrical disconnection of a vertical solder bump interconnection. Solder deposits, which are predecessors of solder bumps, on a solder bump transfer plate formed by vapor phase deposition through through-holes of a metal mask are often detached from deposited sites when the metal mask is separated from the solder bump transfer plate, because the solder deposits are often adhering to inside walls of the through-holes. In Japanese Laid-open Patent Application No.5-235003, a method is described that an inside wall of a through-hole of a metal mask is lined with material having non-wettable tendency to molten solder. In this method, however, repelled solder is solidified around a solder bump, in cooling, as solder bridges or solder balls which often cause a short circuit between adjacent terminal pads.

A solder ball is usually produced on a surface of a semiconductor chip between terminal pads from an excessive amount of solder extending to the outskirts of a solder deposit, deposited on a solder bump transfer plate using a metal mask when the solder deposit is melted, so as to transfer onto the terminal pad. As an attempt to remove the solder ball described in Japanese Laid-open Patent Application No. 63-261857, photosensitive polyimide film is formed on the whole surface of a semiconductor chip except terminal regions and is dissolved by an organic solvent later. However, this method is incompatible with semiconductor chips having polyimide as an insulating film.

SUMMARY OF INVENTION

It is an object of the present invention to provide a solder bump transfer device for transferring solder bumps onto terminal pads of a semiconductor device without a severe aligning requirement.

It is another object of the present invention to provide a solder bump transfer device for transferring solder bumps onto terminal pads having a fine size and a narrow spacing on a semiconductor device without leaving solder bridges or solder balls between the terminal pads.

It is a further object of the present invention to provide a method for transferring solder bumps having a uniformity in height and strength onto terminal pads of a semiconductor device.

It is a still further object of the present invention to provide a mask for forming solder deposits on a surface of a substrate, or a plate, by vapor phase deposition through through-holes of the mask and for being removed easily without detaching the solder deposits in the through-holes.

In one aspect of the present inventions both diameter and spacing of solder deposits on a solder bump transfer plate are smaller than diameter and spacing as well of terminal pads on a semiconductor device, whereby a single solder bump is formed on each of the terminal pads without a severe aligning requirement. Needless to say, a cross-sectional area of the solder deposits and an area of the terminal pads are not necessarily limited to a circle. In another aspect of the present invention, the whole surface except terminal pads of a semiconductor device is coated with material non-wettable to molten solder which is removed later together with solder balls remaining thereon.

In a further aspect of the present invention, a mask has through-holes each of a varying diameter which increases, step-wise, from the first surface of the mask to the second surface thereof, opposite to the first surface; as a result, after solder deposits are deposited through the through-holes onto a surface of a solder bump transfer plate against which the second surface of the mask is pressed, the mask is easily removed without detaching a solder deposit in a through-hole.

The techniques according to the present invention may be applicable to any planar surface of a substrate on which plurality of solder bumps are formed, and to stacked flat plates interconnected by solder bumps therebetween.

BRIEF DESCRIPTION OF DRAWINGS

Preferred embodiments of the invention are described with reference to the accompanying drawings, in which.

DESCRIPTION OF THE PREFERRED EMBODIMENTS

Figure 1A:
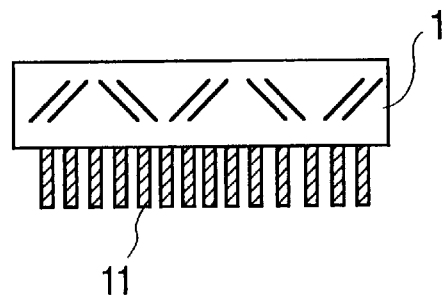
FIGS. 1A through 1D are diagrammatic section views of a pair of a solder bump transfer plate and a semiconductor substrate in various processing steps related to the first embodiment in accordance with the present invention.

Referring to FIG. 1A, a solder bump transfer plate 1 is a glass plate on a surface of which a plurality of solder deposits 11 made of Indium (In) alloy with 48 wt % Tin (Sn) are formed in a matrix, having a spacing of 200 μm and a diameter of 100 μm, by screen printing method. A substrate 2 is an alumina ceramic circuit board for a hybrid IC, on a surface of which a plurality of terminal pads 21 made of 0.1 μm thick electro-plated gold on 0.5 μm thick nichrome (hereafter noted by 0.1 μm thick Au/0.5 μm thick Ni) are arranged in a matrix having a spacing of 800 μm and a diameter of 400 μm.

Figure 1B:
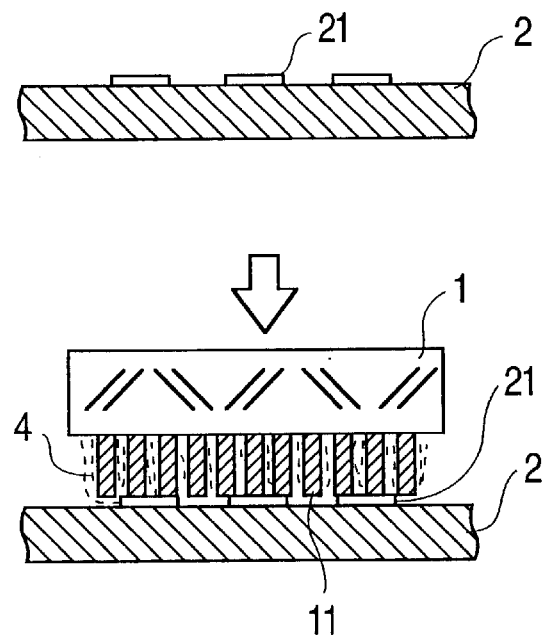

Referring to FIG. 1B, after solder flux 4 is applied, the solder bump transfer plate 1 is positioned on the substrate 2 without a fine alignment such that the same number of the solder deposits 11 rests on each of the terminal pads 21.

Figure 1C:
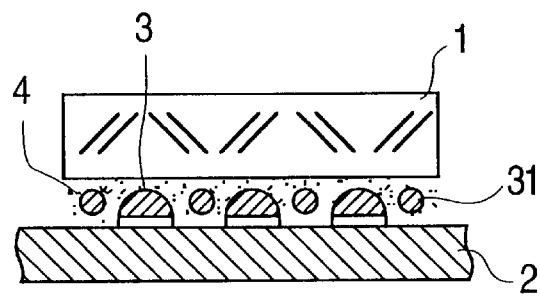

Referring to FIG. 1C, an assembly of the plate I and the substrate 2 is heated to 150° C. for 2 minutes in a furnace such that the solder deposits resting on a terminal pad melt, so as to be transferred onto the terminal pad and form a single solder bump 3, solder deposits not resting on a terminal pad melt to form solder balls 31 in the solder flux 4.

Figure 1D:
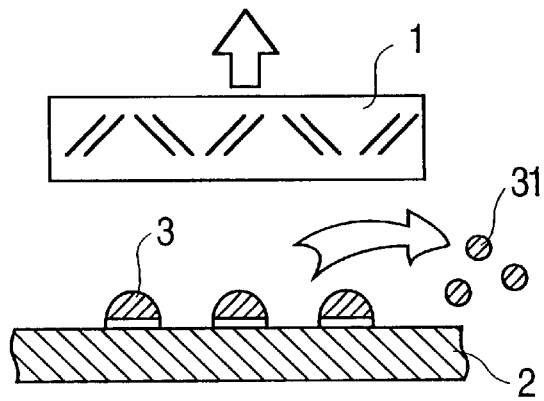

Referring to FIG. 1D, after the assembly is cooled, the substrate 2 is separated from the plate 1 and washed to remove the solder flux together with the solder balls therein, then, an alumina ceramic circuit board 2 having a single solder bump on each of the terminal pads is obtained.

The above example can be modified as follows:

A solder bump transfer plate 1 is a polyimide film, solder deposits 11 made of Indium alloy are formed in a matrix having a spacing of 100 μm, a diameter of 50 μm, and height of 50 μm by employing a metal mask (not shown). Terminal pads 21 made of 0.1 μm thick Au/0.5 μm thick Ni are arranged in a matrix having a spacing of 500 μm and a diameter of 200 μm. After solder flux 4 is applied, the solder bump transfer plate 1 is positioned on the substrate 2 without a fine alignment, and pressed at 150° C. with 5kgf such that the solder deposits 11 resting on the terminal pads 21 are thermally bonded to the terminal pads. The assembly is heated to 220° C. such that the solder deposits resting on a terminal pads are transferred onto the terminal pad to form a single solder bump 3. The rest of process is substantially the same as that of the first example, wherein a substrate may be an Si chip, and the solder the alloy may be Bi, Ga, Ge, Sb, or Pb-63% Sn other than or In-48% Sn.

It should be noticed that since spacing and diameter of the solder deposits 11 are both smaller than those of the terminal pads 21 in these examples, no fine alignment of solder deposits to terminal pads is required.

Figure 2A:
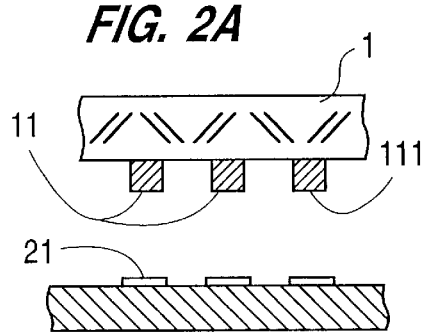
FIGS. 2A through 2F are diagrammatic section views of a pair of a solder bump transfer plate and a semiconductor substrate in various processing steps related to the second embodiment in accordance with the present invention.

Referring to FIG. 2A, a solder bump transfer plate consists of a Si substrate 1 and Pb-5% Sn solder deposits 11 thereon. The solder deposits 11 are deposited through a metal mask (not shown) having through-holes of 130 μm in diameter at the first surface and 170 μm in diameter at the second surface opposite to the first surface by pressing the second surface against the Si substrate 1, where an inside-wall of the through-holes is sloped by an angle of 100° from the first surface. A deposit 111 on the right-most site is intentionally drawn smaller than the other deposits 11, each having a height of 30 μm. A Si substrate 2 for integrated circuits has a plurality of terminal pads 21 which has the same diameter and spacing as those of the solder deposits, respectively in this embodiment.

Figure 2B:
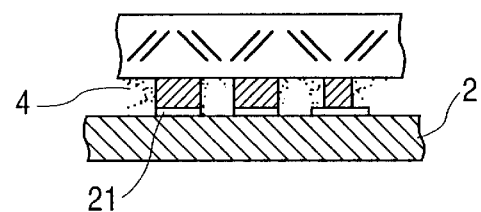

Referring to FIG. 2B, after solder flux is applied, the solder bump transfer plate 1 is positioned on the Si substrate 2 such that each of the terminal pads is aligned with a corresponding one of the solder deposits and all of the aligned solder deposits including the smaller solder deposit 111 are in contact with the corresponding terminal pads. The solder flux is applied to the surface of the solder bump transfer plate 1 the same as before.

Figure 2C:
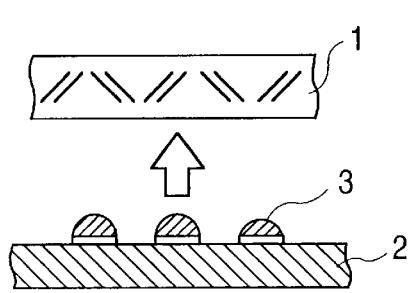

Referring to FIG. 2C, an assembly of the plate and the Si substrate is heated at 360° C. such that each of the solder deposits is transferred onto the corresponding terminal pad to form a single solder bump on each of the terminal pads after separating the plate from the Si substrate and washing away the solder flux.

When the assembly is heated, the solder deposit is melted to transform itself into a droplet of molten solder. Transferring the droplet of molten solder onto the corresponding terminal pad probably arises from collective effects of gravity, a wettable tendency of the terminal pad to molten solder, a non-wettable tendency of the glass plate to molten solder, and a surface tension of the droplet. Therefore, the solid single solder bump maintains a spherical shape covering the entire wettable surface of the metalized terminal pad. A specific single solder bump transferred from the shorter deposit 111 inevitably has a height lower than those of the others. This would cause disconnection of a vertical interconnection if the semiconductor substrate were mounted on a printed circuit board by flip-chip method as it is. The main reason for non-uniformity of the bump height results from non-uniformity of a diameter of through-holes in a metal mask from which they are originated.

Figure 8:
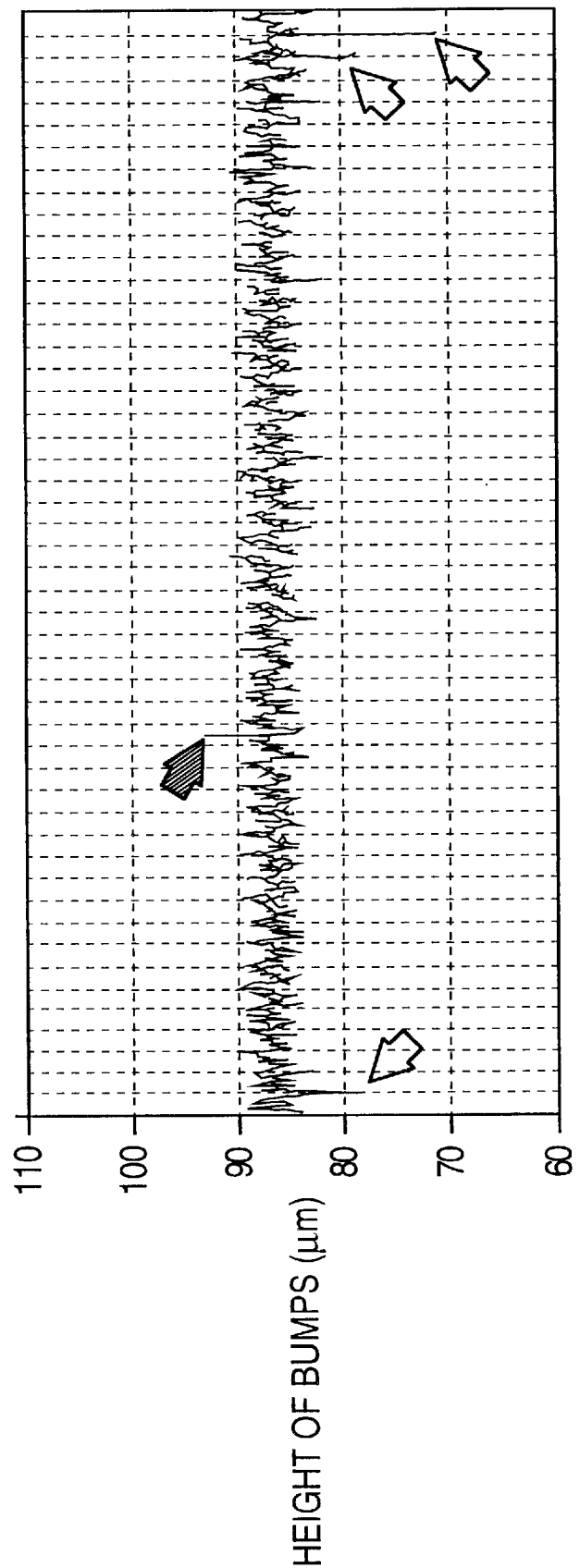
FIG. 8 is a graph showing the height distribution of solder bumps across a semiconductor chip fabricated by a single transferring operation.

FIG. 8 is a graph of height distributions of solder bumps across a chip made by a single transferring operation, which indicates that solder bumps having heights of substantial deviations, as denoted by a solid arrow for a taller bump and an empty arrow for a shorter bump, for example, by more than 10% of the average value, are very few. Since a taller bump can be deformed at flip-chip connection, it is not necessarily considered to be a detective bump. For a practical use, no disconnection is experienced for solder deposits having a height not less than 90% of the average value. Thus, the disconnection problem caused by a shorter bump can be avoided by repeating the entire processing steps from forming solder deposits on a glass plate to transferring solder bumps onto metalized terminal pads of a semiconductor chip. For example, if it is repeated twice, the solder deposits for a single deposition may have half a volume of the finally required volume.

Although a certain precaution is needed to prevent a shorter solder deposit on a bump transfer plate from being systematically aligned to another shorter solder bump at an identical specific site on a semiconductor substrate, if a through-hole of a metal mask has a diameter which is smaller by 20% than the average value at the rate of 1/10,000, the probability that two smaller bumps will meet with each other is less than $(1/10,000)^2$ which is practically a negligible small value. Thus, according to the twice repetition method, for instance, if a semiconductor device has 3,000 terminals on a chip, the disconnection will occur at the rate of less than one out of 30,000 units, while it will occur at the rate of one out of three units by the conventional method. The repetition numbers increase, the defective rate decreases sharply.

The finally required bump height is obtained by twice-repetition repetition of solder deposition, wherein the height of each of the two deposits is one-half of the solder deposit by a single deposition which will give the finally required bump height. Since relative volumes of two cylindrical solder deposits deposited through a circular through-hole having a normal diameter and another circular through-hole having a diameter smaller by 20% than the normal one are 0.5 and 0.5 ×$(10.2)^2$, namely 0.32, respectively, a spherical solder bump made by the above two solder deposits will have a bump height of $(0.5+0.32)^{1/3}$, namely 0.94 which is within ±10% tolerance.

Figure 2D:
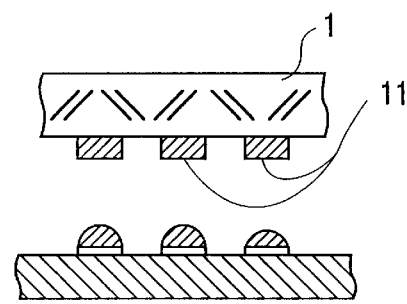

Referring to FIG. 2D, for the reason discussed above, a metal mask having a through-hole whose diameter is less than 80% of the average value is removed as a defective unit in mask inspection.

Figure 2E:
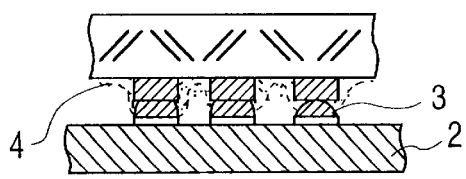

Referring to FIG. 2E, subsequently, the steps are repeated so as to transfer another solder bump onto each of the single solder bumps already made on the terminal pads by the previous steps.

Figure 2F:
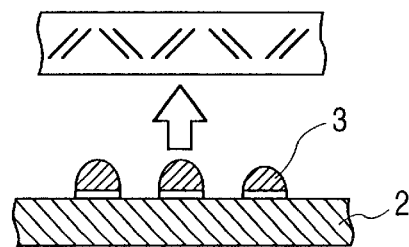

Referring to FIG. 2F, after separating the plate, and washing away the solder flux, the Si substrate 2 is obtained which has a single solder bump on each of the terminal pads whose height is higher than that of the first single solder bump and that an error of the height will be less than 10% of the average value.

An application of the above repetition method to a Si substrate showed an average height of the solder bumps 84.3 μm high, the minimum height 87.9 μm high, and the maximum height 87.9 μm high. By employing this Si substrate, a CPU module is assembled with a nitric aluminium circuit board by flip-chip bonding method without flux wherein no defective unit is found out at electric testing in vertical interconnections. Similar experimental data are summarized in Table 1 and 2, where Table 1 shows heating temperatures for various bump solders and Table 2 shows bump heights for the various bump solders.

TABLE 1

| Bump solders | Transfer temperature | Deoxidized temperature | Bonding temperature |
| --- | --- | --- | --- |
| Pb-63 wt % Sn | 220° C. | 210° C. | 260° C. |
| In | 200° C. | 180° C. | 260° C. |
| In-34 wt % Bi | 200° C. | 150° C. | 260° C. |

TABLE 2

| Bump solders | Average height | Minimum height | Maximum height |
| --- | --- | --- | --- |
| Pb-63 wt % Sn | 83.8 μm | 79.1 μm | 87.5 μm |
| In | 84.1 μm | 79.6 μm | 88.5 μm |
| In-34 wt % Bi | 84.0 μm | 78.0 μm | 87.4 μm |

As an example, by employing a metal mask having through-holes of a nominal diameter of 150 μm on the first surface and a nominal diameter of 180 μm on the second surface with an inside wall having a tapering angle 100° from the first surface, which actually has an average diameter 150 μm and a minimum diameter larger than 125 μm, cylindrical solder deposits of Pb-5wt % Sn were formed on a solder bump transfer glass plate, producing spherical solder bumps of an average height of 85 μm and a minimum height of 75 μm, and then transferred onto Ni-metalized terminal pads on a Si substrate at 360° C. This transfer processing step was repeated twice. The following measurement of bump heights revealed that an average height of 84.9 μm, a minimum height of 78.3 μm, and a maximum height of 90.1 μm. The Si substrate with these bumps was mounted on an AlN substrate by flip-chip method to complete a CPU module. Electrical reliability tests on these devices gave a result that no defective units were found out. Particularly, it was experienced from various reliability tests that a hourglass shaped solder bump connecting both substrates at terminal pads is more desirable than a barrel shaped solder bump, because a thermal stress may easily concentrate on an interface between a solder bump and the connecting terminal pad while easy inelastic deformation of a solder bump near the middle point would absorb the thermal stress.

From these experiments it has been assured that a combination of selecting a metal mask by inspecting through-holes such that the minimum diameter of the through-hole is determined in advance and of repeating transfer of solder bumps is effective for equalizing the final height of the solder bumps.

A method for fabricating a flip-chip device comprising two major processing steps is effective to achieve a remarkable result in higher reliability in electric interconnections, wherein the two major processing steps are firstly to select a metal mask by inspecting through-holes such that an acceptable mask has through-holes whose opening area has a predetermined minimum limit in unavoidable deviation from the average value, and secondly to repeat the solder bump transfer process until every bumps reach a finally required height on metalized terminal pads of a substrate. The method effectively eliminates defective units having disconnection failure.

Figure 3A:
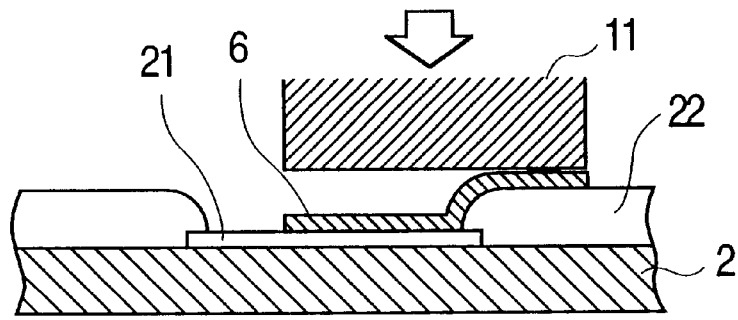
FIGS. 3A through 3C are diagrammatic section views of a solder bump on a semiconductor substrate in various processing steps related to the third embodiment in accordance with the present invention.

Referring to FIG. 3A, a basic part of the method for forming solder bumps on terminal pads on a semiconductor substrate for this embodiment is the same that as shown in FIGS. 2A through 2C. However the semiconductor substrate thereof, 2 had an insulating layer 22 on an entire surface except for the terminal pads 219 and also had a metal pattern 6 partly on the terminal pads 21 and partly on the insulating layer 22 such that a surface of the corresponding terminal pad was partly exposed. The terminal pad 21 was metalized by nickel, which may be replaced by other metals wettable to molten solder such as Au, Ti, Cu, Cr or any combination of these. The insulating layer 229 which was polyimide, was non-wettable to molten solder The metal pattern 6 was 0.5 μm thick gold layer and had essentially the same diameter as that of the solder deposit. The metal pattern 6 was wettable to molten solder and easily melts into the molten solder In the step of positioning the solder bump transfer plate on the semiconductor substrate 29 each of the solder deposits 11 was aligned to, and in contact with, the metal pattern 6 which was already aligned eccentrically from the corresponding terminal pad 210

Figure 3B:
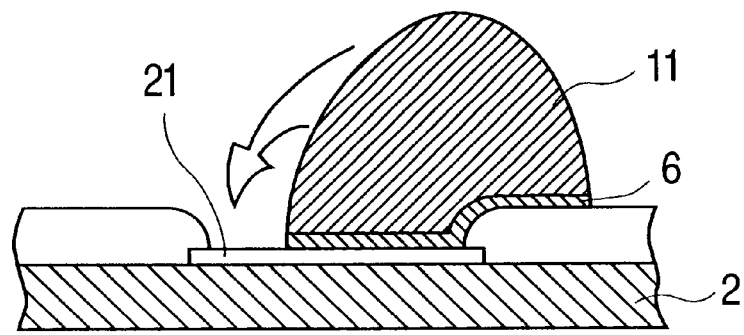

Referring to FIG. 3B, by heating the solder deposit was melted into a solder droplet 11 resting on the metal pattern 6 in an early stage and, subsequently, the metal pattern 6 was also melted into the solder droplet. Melt-down of the metal pattern 6 made the solder droplet contact with both the-insulating sayer 22 and the terminal pad 21, which resulted-in a repulsive force pushing the solder droplet fully onto the terminal pad 21 and, simultaneously, an attractive force pulling the solder droplet onto the exposed surface of the terminal pad 21 as indicated by an arrow. A fact that a surface of the insulating layer was higher than that of the terminal pad also assisted the solder droplet to move to a center of the terminal pad by gravitational force.

Figure 3C:
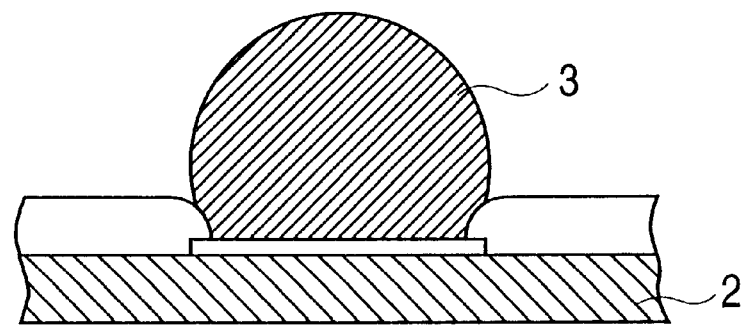

Referring to FIG. 3C, at the final stage, a surface tension made the solder droplet spherical, resting on the entire surface of the terminal pad 21 within an opening of the insulating layer, by cooling, the solder droplet was solidified into a solder bump 3 which maintained a spherical shape concentric with the terminal pad 21.

Figure 4A:
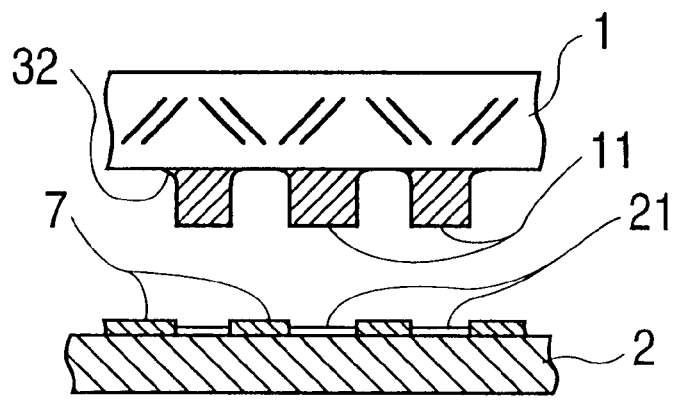
FIGS. 4A through 4D are diagrammatic section views of a pair of a solder bump transfer plate and a semiconductor substrate in various processing steps related to the fourth embodiment in accordance with the present invention.

Referring to FIG. 4A, a solder bump transfer plate I had solder deposits 11, each of which usually had a tapering part 32 around the solder deposit. The tapering part 32 was, more or less, concomitantly formed by depositing Pb-5w% Sn solder deposits of 30 μm high through a metal mask (not shown) by vapor phase deposition. The metal mask had through-holes of 130 μm in diameter at the first surface and 170 μm in diameter at the second surface opposite to the first surface. The deposition was carried out by pressing the second surface against the Si substrate 1, where an inside wall of the through-holes was tapered by an angle of 100° from the first surface. A semiconductor substrate 2 had terminal pads 7 on the surface and a 0.1 μm thick aluminium layer 21 therebetween. The terminal pads 7 were metalized by gold. The aluminium layer 21 was non-wettable to molten solder.

Figure 4B:
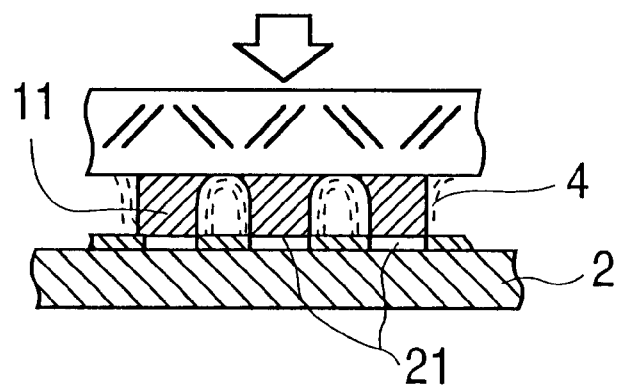

Referring to FIG. 4B, after applying solder flux, the solder bump transfer plate was positioned on the substrate 2 by aligning the solder deposits to the gold metalized terminal pads; then, the assembled substrate was heated at 360° C. until each of the solder deposits were melted into a single solder droplet on the corresponding terminal pad.

Figure 4C:
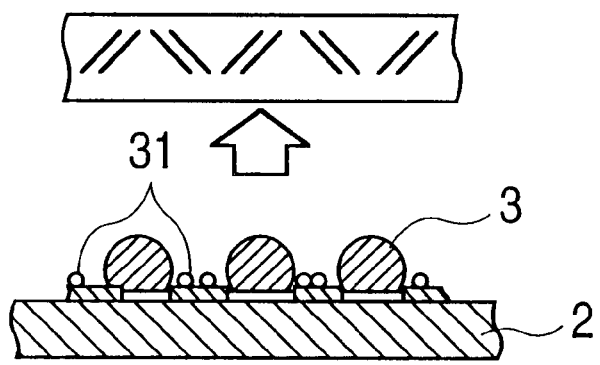

Referring to FIG. 4C, after cooling the assembled substrate, and then separating the glass plate I from the substrate 2, a solidified spherical single solder bump 3 was formed on each of the terminal pads and solder balls 31 were left on the aluminium layer 21 with remainder of the solder flux 11.

Figure 4D:
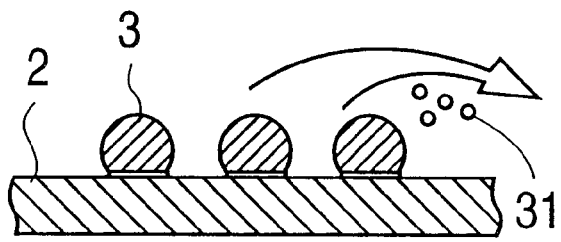

Referring to FIG. 4D, by washing away the solder flux and then immersing the substrate into an etchant consisting of 90 ml water, 15 ml HCL, and 10 ml HF to remove the aluminium layer 21 and solder balls 31 together, the substrate 2 having the single solder bumps on the terminal pads 7 was finally obtained.

As a non-wettable layer to molten solder formed on an entire surface except terminal pads, heat resistant polymer like polyimide is easily removed by basic solution, but for a substrate already employing polyimide for a component, a metal layer like aluminium is preferred in selective etching without etching solder bumps and metalized terminal pads.

Figure 5A:
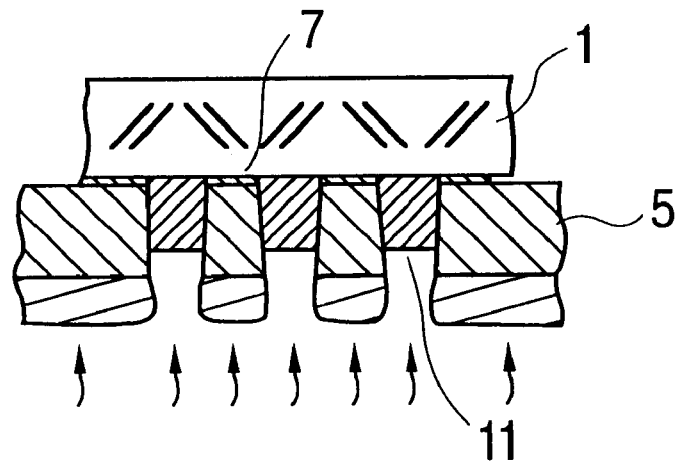
FIGS. 5A through 5D are diagrammatic section views of a pair of a metal mask and a solder bump transfer plate in various processing steps related to the fifth embodiment in accordance with the present invention.

Referring to FIG. 5A, Pb-5wt % Sn solder deposits 11 of 30 μm high were formed on a solder bump transfer glass plate 1 by using a metal mask 5, wherein in advance of depositing the solder deposits 11, an aluminium layer 7 of 0.1 μm thick was deposited on the entire surface of the glass plate 1 except areas for the solder deposits It to be deposited, and the metal mask had through-holes of 130 μm in diameter on the first surface and 170 μm in diameter on the second surface with an inside wall of a tapering angle 100° from the first surface. The second surface of the metal mask was pressed against the surface of the glass plate 1 when the solder deposits 11 were formed.

Figure 5B:
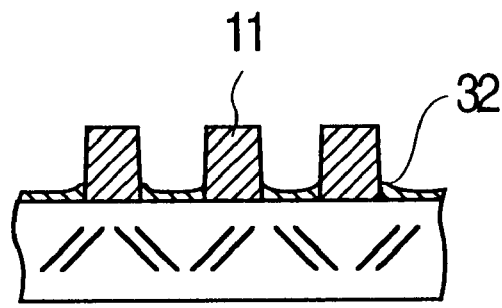

Referring to FIG. 5B, after separating the metal mask 5 from the solder bump transfer glass plate 1, a tapering part 32 was unavoidably left on the aluminium layer 7 around each of the solder deposits 11.

Figure 5C:
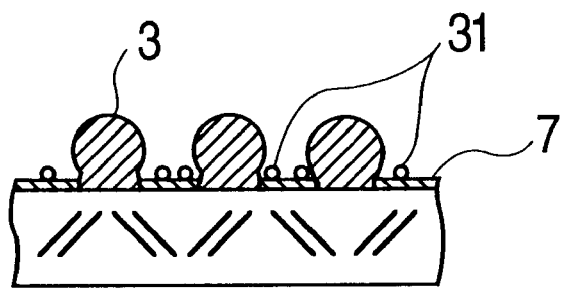

Referring to FIG. 5C, by heating the solder bump transfer glass plate 1 at 320° C. in an atmosphere of $N_2$—$H_2$(4:1 in volume), each of the solder deposits 11 changed into a spherical solder bump on the solder bump transfer glass plate 1 while the tapering part 32 changed into solder balls 31 on the aluminium layer 7.

Figure 5D:
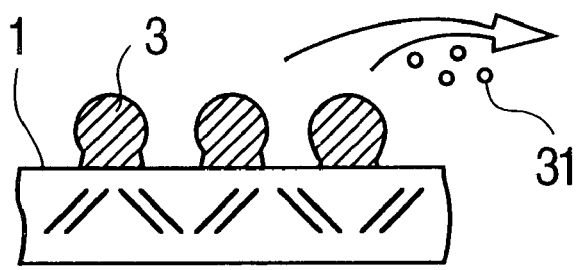

Referring to FIG. 5D by immersing the solder bump transfer glass plate 15 into an etchant consisting of 90 ml distiled water, 15 ml HC1, and 10 ml HF, the aluminium layer 7 surrounding each of the solder deposits 11 was removed together with the solder balls 31 completely. Thus, a solder bump transfer glass plate 1 was obtained which had spherical solder bumps 3 without a tapering part 32 or a solder ball 31 around the spherical solder bumps.

Figure 6:
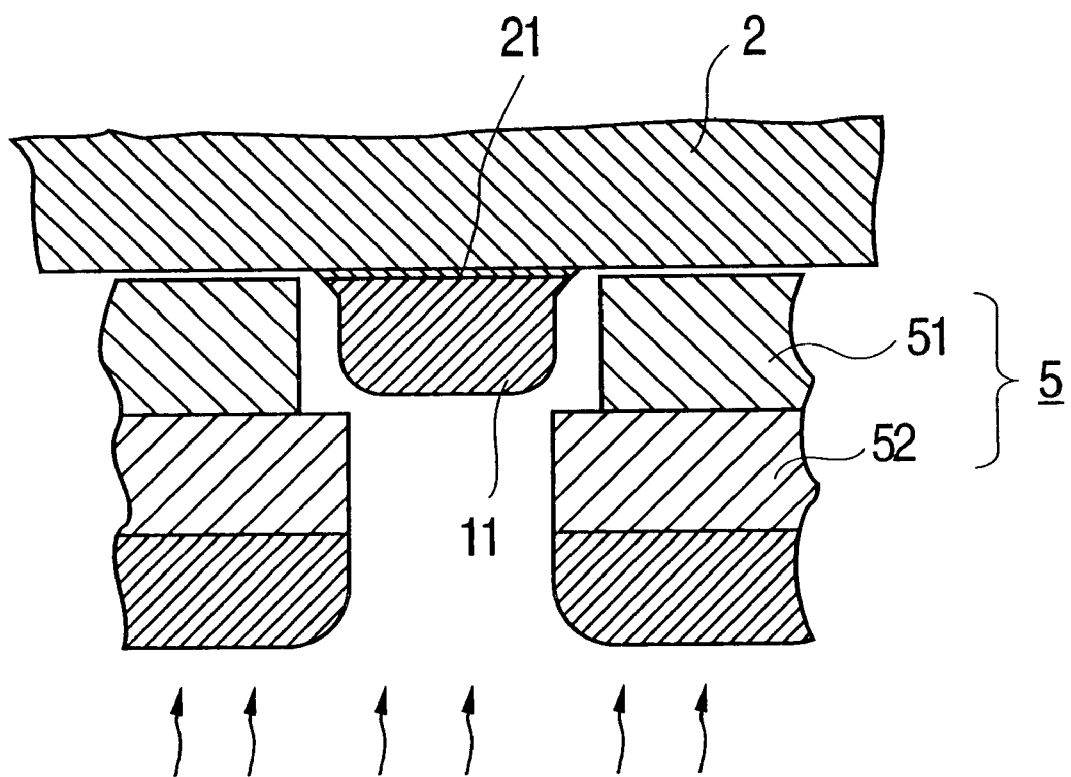
FIG. 6 is a diagrammatic section view of a pair of a metal mask and a solder bump transfer plate related to the sixth embodiment in accordance with the present invention.

Referring to FIG. 6, a metal mask 5 was a laminated mask consisting of the first mask 51 of 50 μm thick 42Nickel Nickel (Ni) alloy and the second mask 52 of 50 μm thick 42-Ni alloy. The first and second masks had concentric holes of 170 μm and 140 μm in diameters, respectively. A substrate 2 for printed circuits had terminal pads 21 of 100 μm in diameters metalized by a triple layer of Au(top) /Ni/Ti (bottom). To form a plurality of solder bumps on the substrate 2, the hole of the mask 5 was aligned to the terminal pad pressing the second mask against the substrate 2 by a magnetic mask-holder (not shown). Subsequently, a solder deposit of 30 μm in height was deposited on the substrate by vapor phase deposition of Pb-5wt % Sn solder through each of the concentric holes over the first mask. Since the solder deposits formed on the substrate in concentric holes of the metal mask were not in contact with side walls of the concentric holes, none of the solder deposits was found to be defective after the metal mask 5 was separated from the substrate 2. Et made mask-separation without detaching solder deposits possible that a hole of the first metal mask was smaller than that of the second metal mask. For deoxidizing and shaping the solder bumps 3, the substrate 2 was coated with a solder flux and then heated at a temperature higher than 314° C. to melt the solder bumps. After cooling the substrate 2 and washing the solder flux away, the substrate 2 having a plurality of spherical solder bumps was completed without a defective bump.

Thus, a flip-chip bonded device will be easily constructed by positioning the above-completed substrate 2, having a plurality of spherical solder bumps, on a Si chip having Au/Ni/Ti metalized terminal pads and, subsequently, reflowing the solder bumps in $N_2$ atmospheric furnace at a temperature of 350° C.

Referring to FIG. 6, Pb-5wt % Sn solder in the above example was replaced by Indium (In) solder, which changed the bump transferring temperature from 314° C. to 215 ° C., and the flip-chip bonding temperature from 350° C. to 260 ° C., respectively. Indium solder bumps was formed on the metalized terminal pads of the Si chip in advance of flip-chip bonding, which was actually carried out by bonding the In solder bumps to each other between the Si chip and the substrate for printed circuit board$_9$ wherein the In solder bumps were bonded to each other at a temperature of 260° C. in a vapor of fluorocarbon without solder flux.

Figure 7A:
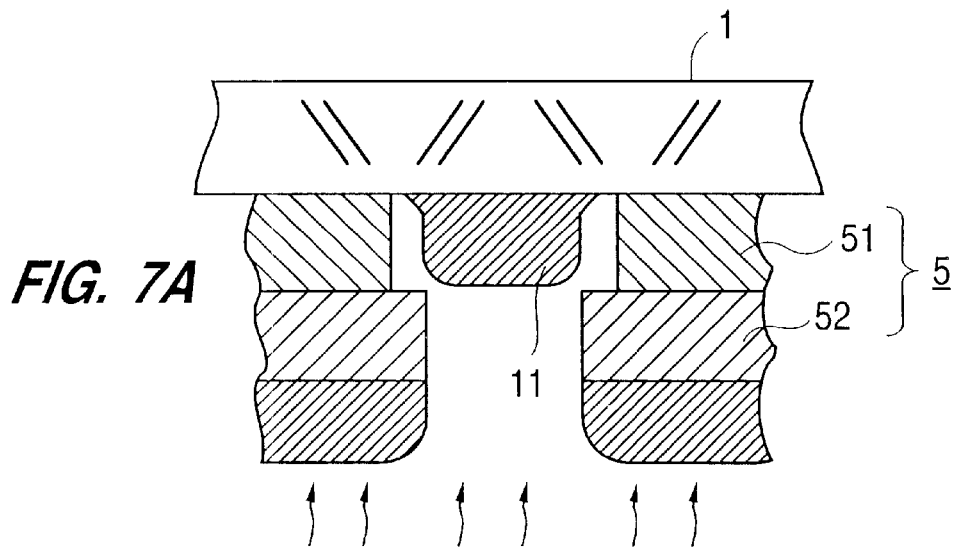
FIGS. 7A through 7D are diagrammatic section views of a solder bump transfer plate, a metal mask, and a semiconductor substrate in various processing steps related to the seventh embodiment in accordance with the present invention.

Referring to FIG. 7A a metal mask 5 was a laminated 42 Ni-alloy mask consisting of the first mask 51 having holes of 170 μm in diameter and 50 μm in thickness and the second mask 52 having holes of 140 μm in diameter and 50 μm in thickness as referred to FIG. 6. The metal mask was pressed against a Si substrate 1 functioning as a solder bump transfer plate, such that each of the holes of the first mask was concentrically aligned with a corresponding one of the holes of the second mask by employing a mask holder (not shown) in a solder deposition chamber (also not shown). Pb-63% Sn solder of 30 μm thick was deposited over the metal mask 5 and subsequently the mask was separated from the Si substrate to form solder deposits 11 on the Si substrate. Thus, the completed solder bump transfer plate was obtained without any defective bumps.

Figure 7B:
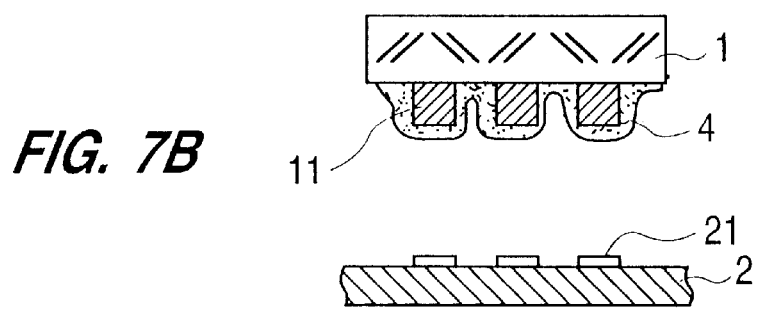

Referring to FIG. 7B, another Si substrate 2 was provided to transfer solder bumps from the solder bump transfer plate. The Si substrate 2 already had integrated circuits therein and a plurality of Ni/Ti metalized terminal pads 21 on a surface of the Si substrate.

Figure 7C:
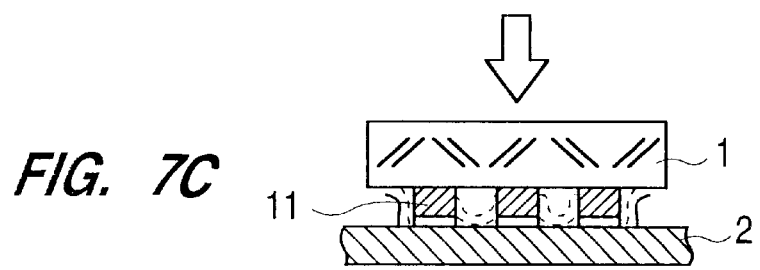
Figure 7D:
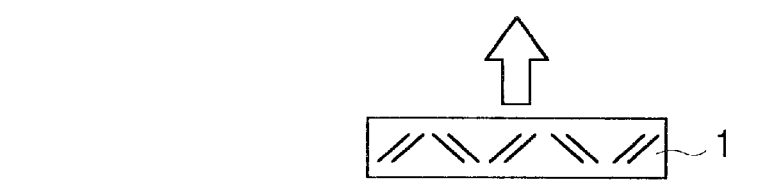
Figure 7D:
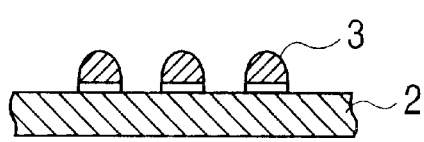

Referring to FIG. 7C, the solder bump transfer plate was positioned on the Si substrate 2 with solder flux 4 such that each of the deposits 11 was aligned to the corresponding Ni/Ti metalized terminal pads 219 and then the whole substrate was heated at a temperature of 250° C. in an $N_2$ atmospheric furnace (also not shown) such that the solder bumps were reflowed and thereby transferred to the Ni/Ti metalized terminal pads 21.

Referring to FIG. 7B, after the solder bump transfer plate 1 was separated from the Si substrate 2, to deoxidize and reshape the solder bumps 3, the substrate 2 was coated by solder flux and again heated at a temperature of 250° C. to melt the solder bumps. After cooling the substrate 2 and washing the solder flux away the substrate 2 having a plurality of spherical solder bumps was completed without a defective bump.

Referring to FIGS. 7A through 7D, Pb-5wt % Sn solder in the above example can be replaced by other solders containing In, Bi, Ga, or Sb. The bump transfer plate can be chosen from ceramics and heat resistant polymer like polyimide instead of Si and glass. The terminal pads can be metalized by various combination of metal layers such as Au/Ni/Ti or Cu/Cr depending upon bump materials.

While the invention has been described having references in particular preferred embodiments and modifications thereto, various changes in form and detail may be made without departing the spirit and scope of the invention as claimed.

What is claimed is:

1. A method for forming solder bumps on terminal pads disposed on a surface of a semiconductor substrate, comprising the steps of:
   (1) providing a solder bump transfer plate having a plurality of solder deposits on a surface thereof which has a non-wettable characteristic relatively to molten solder;
   (2) coating a material on the entire surface of the semiconductor substrate except for the terminal pads disposed thereon, the material having a non-wettable characteristic relatively to molten solder,
   (3) positioning the solder bump transfer plate on the semiconductor substrate such that each of the solder deposits rests on a respective one of the terminal pads, throughout the entire surface of the substrate;
   (4) heating the solder bump transfer plate, positioned on the semiconductor substrate, such that each solder deposit melts and forms a single, corresponding molten solder bump on the respective terminal pad, molten solder not included in a corresponding molten solder bump forming molten solder balls in the material between the terminal pads;
   (5) cooling the solder bump transfer plates positioned on the semiconductor substrate, to solidify the molten solder bumps on the respective terminal pads and the molten solder balls in the material;
   (6) separating the solder bump transfer plate from the semiconductor substrate such that the solidified solder bumps remain firmly on the respective terminal pads and the solidified solder balls remain in the materials the solder bumps having substantially the same height throughout the entire surface of the substrate; and
   (7) removing the material together with the solder balls from the semiconductor substrate.

2. The method according to claim 1, wherein a diameter of each of the solder deposits and a spacing between nearest neighbors of the solder deposits on the solder bump transfer plate are both smaller than each of the diameter of each of the terminal pads and the spacing between nearest neighbors of the terminal pads.

3. The method according to claim 1, wherein the material is polyimide for the semiconductor substrate consisting of elements having resistance against processes for removing the polyimide material.

4. The method according to claim 1, further comprising:
   at step (3), aligning the solder deposits with the respective terminal pads in an eccentric relationship such that each solder deposit rests partly on a portion of the substrate surface outside the respective terminal pad; and
   at step (4), the solder deposits are melted such that each solder deposit reflows to form a single molten solder bump covering a whole surface of the respective terminal pad and in a concentric arrangement therewith.

5. The method according to claim 4, further comprising, in advance of aligning the solder deposits with the respective terminal pads, patterning a metal layer to include a layer portion on each of the terminal pads and partly extending to a portion of the substrate surface outside of the respective terminal pad on which the solder deposit rests, the metal layer being wettable relatively to molten solder and easily melting into the single molten solder bump.

6. A method for transferring solder bumps onto terminal pads on a semiconductor substrate for an integrated circuit devices comprising the steps of:
   (1) providing a plate having a planar surface which is non-wettable relatively to molten solder and is a size sufficient enough to cover all of the terminal pads on the semiconductor substrate;
   (2) providing a mask having a first surface and a second surface opposite to the first surface, the mask having a plurality of through-holes, the respective cross-sectional areas of which increase, step wise, from the first surface of the mask to the second surface thereof, the mask being of a size sufficient to cover all of the terminal pads on the semiconductor substrate;
   (3) pressing the second surface of the mask against the planar surface of the plate;
   (4) depositing solder over the mask by vapor phase deposition such that a solder deposit is formed on the planar surface of the plate within each of the through-holes and without contacting an inside wall thereof, the respective solder deposits within the plurality of through-holes being of uniform height relatively to, and throughout, the planar surface; and
   (5) separating the mask from the planar surface of the plate such that the respective solder deposits within the plurality of through-holes remain on the planar surface of the plate.

7. A method for fabricating a semiconductor substrate having a single solder bump on each of plural terminal pads thereon, for an integrated circuit comprising the steps of:

(1) providing a plate having a planar surface which is non-wettable to molten solder and is of a size sufficient to cover all of the terminals pads on the semiconductor substrate;

(2) providing a mask having a first surface and a second surface opposite to the first surface, the mask having a plurality of through-holes, the respective cross-sectional areas of which increase, step wise, from the first surface of the mask to the second surface thereof, the mask being of a size sufficient to cover all of the terminal pads on the semiconductor substrate;

(3) pressing the second surface of the mask against the planar surface of the plate;

(4) depositing solder over the mask by vapor phase deposition such that a solder deposit is formed on the planar surface of the plate, within each of the through-holes and without contacting an inside wall thereof, the respective solder deposits within the plurality of through-holes being of a uniform height relatively to and throughout the planar surface; and (5) separating the mask from the planar surface of the plate such that the respective solder deposits within the plurality of through-holes remain on the planar surface of the plate thereby to produce a solder bump transfer plate having a planar surface which is non-wettable to molten solder, solder deposits being arranged on the planar surface of the plate such that each of the solder deposits corresponds to one of the terminal pads;

(6) coating material on an entire surface of the semiconductor substrate except the terminal pads thereon, the material having a non-wettable tendency relatively to molten solder;

(7) positioning the solder bump transfer plate on the semiconductor substrate such that all of the solder deposits rest on the corresponding terminal pads throughout the entire surface of the semiconductor substrate;

(8) heating the plate, as positioned on the semiconductor substrate, such that each solder deposit melts and forms a single molten solder bump on the corresponding terminal pad and molten solder not included in a corresponding molten solder bump forms molten solder balls in the material between the terminal pads;

(9) cooling the solder bump transfer plate on the semiconductor substrate to solidify the molten solder bumps on the corresponding terminal pads and the molten solder balls in the material,

(10) separating the solder bump transfer plate from the semiconductor substrate such that the solidified solder bumps remain firmly on the corresponding terminal pads and the solidified solder balls remain in the material; and

(11) subsequently removing the material and the solder balls from the semiconductor substrate.

8. The method according to claim 7, further comprising:

positioning each solder bump transfer plate on the semiconductor substrate such that the solder deposits rest on the corresponding terminal pads; and maintaining a uniform clearance between the solder bump transfer plate and the semiconductor substrate throughout the entire surface of the semiconductor substrate by pressing the solder bump transfer plate against the semiconductor substrate uniformly until all of the solder deposits, facing the respective terminal pads, make contact with the respective terminal pads.

9. The method for fabricating a semiconductor substrate according to claim 7, further comprising, prior to step 7, applying solder flux to the solder bump transfer plate.

10. The method according to claim 6, further comprising the steps of:

selecting the mask such that circular through-holes in the first surface of the mask have a minimum diameter larger than 80% of an average value, before depositing a solder alloy over the mask by vapor phase deposition; and repeating the steps from step (7) to step (11) successively until the single solder bump has a minimum height that is larger than 90% of a finally required height, throughout the entire surface of the semiconductor substrate.

11. The method according to claim 1, wherein the solder bumps are formed onto the terminal pads of a semiconductor substrate for an integrated circuit device.

12. The method according to claim 6, wherein the solder bumps are formed onto the terminal pads of a semiconductor substrate for an integrated circuit device.

13. The method according to claim 7, wherein the solder bumps are formed onto the terminal pads of a semiconductor substrate for an integrated circuit device.

14. A method comprising the steps of:

forming plural solder deposits on a surface of a plate, the plate surface having a non-wetting characteristic relatively to molten solder;

coating a material on a surface of a semiconductor substrate except four plural terminal pads formed thereon, the material having a non-wettable characteristic relatively to molten solder;

aligning the plate-and the semiconductor substrate and positioning same such that the plural solder deposits rest respectively on the plural terminal pads and, while so positioned:

(1) melting the solder deposits such that each solder deposit forms a corresponding, individual molten solder bump on the respective terminal pad, excess molten solder not included in a molten solder bump forming molten solder balls in the material between the terminal pads;

solidifying the molten solder bumps on the respective terminal pads and the molten solder balls in the material;

separating the plate from the semiconductor substrate; and removing the material with the solidified solder balls therein from the semiconductor substrates.

15. The method according to claim 14, wherein a diameter of each of the solder deposits and a spacing between nearest neighbors of the solder deposits on the solder bump transfer plate are both smaller than each of the diameter of each of the terminal pads and the spacing between nearest neighbors of the terminal pads.

16. The method according to claim 14, wherein the material is polyimide for the semiconductor substrate consisting of elements having resistance against processes for removing the polyimide material.

17. The method according to claim 14, further comprising:

at step (3), aligning the solder deposits with the respective terminal pads in an eccentric relationship such that each solder deposit rests partly on a portion of the substrate surface outside the respective terminal pad.- and at step (4), the solder deposits are melted such that each solder deposit reflows to form a single molten solder bump covering a whole surface of the respective terminal pad and in a concentric arrangement therewith.

18. The method according to claim 17, further comprising, in advance of aligning the solder deposits with the respective terminal pads, patterning a metal layer to include a layer portion on each of the terminal pads and partly extending to a portion of the substrate surface outside of the respective terminal pad on which the solder deposit rests, the metal layer being wettable relatively to molten solder and easily melting into the single molten solder bump.

* * * * *

UNITED STATES PATENT AND TRADEMARK OFFICE
CERTIFICATE OF CORRECTION

PATENT NO. : 6,008,071
DATED : December 28, 1999
INVENTOR(S) : Kazuaki Karasawa et al.

It is certified that error appears in the above-identified patent and that said Letters Patent is hereby corrected as shown below:

Col. 12, lines 24-49, delete claim 14 and substitute the following claim 14:

14. A method comprising the steps of:
(1) forming plural solder deposits on a surface of a plate, the plate surface having a non-wetting characteristic relatively to molten solder;
(2) coating a material on a surface of a semiconductor substrate except for plural terminal pads formed thereon, the material having a non-wettable characteristic relatively to molten solder;
(3) aligning the plate and the semiconductor substrate and positioning same such that the plural solder deposits rest respectively on the plural terminal pads and, while so positioned:
(4) melting the solder deposits such that each solder deposit forms a corresponding, individual molten solder bump on the respective terminal pad, excess molten solder not included in a molten solder bump forming molten solder balls in the material between the terminal pads;

UNITED STATES PATENT AND TRADEMARK OFFICE
CERTIFICATE OF CORRECTION

PATENT NO. : 6,000.071
DATED : December 28, 1999
INVENTOR(S) : Kazuaki Karasawa

It is certified that error appears in the above-identified patent and that said Letters Patent is hereby corrected as shown below:

(5) solidifying the molten solder bumps on the respective terminal pads and the molten solder balls in the material;

(6) separating the plate from the semiconductor substrate; and (7) removing the material with the solidified solder balls therein from the semiconductor substrates.

Signed and Sealed this

Fifth Day of December, 2000

Attest:

Q. TODD DICKINSON

Attesting Officer

Director of Patents and Trademarks

UNITED STATES PATENT AND TRADEMARK OFFICE
CERTIFICATE OF CORRECTION

PATENT NO.:     6,008.071
DATED      :    December 28, 1999
INVENTOR(S):    Kazuaki KARASAWA et al.

It is certified that error appears in the above-identified patent and that said Letters Patent is hereby corrected as shown below:

Col. 9,     line 66, change "plates" to --plate,--.

Col. 10,    line 6, change "materials" to --material,--;
            line 67, delete "for an integrated circuit".

Signed and Sealed this

Twentieth Day of February, 2001

Attest:

NICHOLAS P. GODICI

*Attesting Officer*    Acting Director of the United States Patent and Trademark Office